United States Patent [19]

Viitanen

[11] Patent Number: 5,578,360

[45] Date of Patent: Nov. 26, 1996

[54] THIN FILM REINFORCING STRUCTURE AND METHOD FOR MANUFACTURING THE SAME

[75] Inventor: Veli-Pekka Viitanen, Espoo, Finland

[73] Assignee: Outokumpu Instruments Oy, Espoo, Finland

[21] Appl. No.: 447,737

[22] Filed: May 23, 1995

Related U.S. Application Data

[63] Continuation of Ser. No. 57,120, May 3, 1993, abandoned.

[30] Foreign Application Priority Data

May 7, 1992 [FI] Finland ..................................... 922060

[51] Int. Cl.$^6$ ........................................................ B32B 3/10
[52] U.S. Cl. ......................... 428/138; 428/131; 428/134; 428/195; 428/332; 428/337; 428/473.5; 430/11; 430/18; 430/322; 430/325; 378/161
[58] Field of Search ..................................... 428/131, 134, 428/138, 195, 199, 332, 337, 411.1, 473.5; 430/11, 18, 312, 313, 322, 325; 378/161

[56] References Cited

U.S. PATENT DOCUMENTS

| | | | |
|---|---|---|---|
| 4,079,159 | 3/1978 | Sano et al. | 428/172 |
| 4,253,029 | 2/1981 | Lepselter et al. | 250/505 |
| 4,254,174 | 3/1981 | Flanders et al. | 428/209 |
| 4,426,247 | 1/1984 | Tamamura et al. | 156/643 |
| 4,522,842 | 6/1985 | Levinstein et al. | 427/8 |
| 4,677,042 | 6/1987 | Kato et al. | 430/5 |
| 4,770,974 | 9/1988 | Hiraoka | 430/270 |
| 4,808,682 | 2/1989 | Schwalm et al. | 526/279 |
| 4,939,052 | 7/1990 | Nakagawa | 430/5 |
| 4,999,280 | 3/1991 | Hiraoka | 430/330 |
| 5,039,203 | 8/1991 | Nishikawa | 359/894 |
| 5,145,940 | 9/1992 | Wernet et al. | 528/226 |
| 5,258,091 | 11/1993 | Imai et al. | 156/613 |
| 5,300,403 | 4/1994 | Angelopolus et al. | 430/325 |

Primary Examiner—Patrick Ryan
Assistant Examiner—Marie R. Yamnitzky
Attorney, Agent, or Firm—Smith-Hill and Bedell

[57] ABSTRACT

The invention relates to a reinforcing structure for a thin film, particularly for an ultrathin film permeable to X-ray and ultraviolet radiation, and a method for manufacturing a reinforcing structure for a thin film with a thickness less than 5 micrometers. According to the invention, on the surface of the thin film, there is formed, in a bakeing treatment of at least one step, a reinforcing structure made of some photosensitive material such as polymer.

10 Claims, No Drawings

THIN FILM REINFORCING STRUCTURE AND METHOD FOR MANUFACTURING THE SAME

CROSS-REFERENCE TO RELATED APPLICATION

This application is filed as a continuation of patent application No. 08/057,120 filed May 3, 1993 and now abandoned.

The invention relates to a reinforcing structure of a thin film, particularly an ultrathin film permeable to X-ray and ultraviolet radiation, and to a method for manufacturing the reinforcing structure of a photosensitive material.

Ultrathin films, with a thickness within the region of 10 nanometers–5 micrometers, which are permeable to X-rays, can be manufactured for instance of plastic materials, such as polyimide. This type of film made of polyimide is known for example from the U.S. Pat. Nos. 4,119,234 and 5,090,046. In the said publications, ultrathin films are used in order to make thin detector windows for X-ray analyzers. The ultrathin films used as detector windows in X-ray analyzers are normally attached and simultaneously supported, at their edges only, by means of a fastening member in between the film and the X-ray analyzer wall. Consequently the handling of ultrathin films for instance during transport is cumbersome, because tensions are easily created in the films owing to the inelastic nature of the joint, and these tensions may break the film which is supported at the edges only. Films supported at the edges are normally small in area, which in part limits the usability of these ultrathin films, because part of the desired radiation information may be spread outside the detector window.

The usability of ultrathin films has also been improved by providing the film with a reinforcing structure made of silicon or metal, for instance. Such a silicon reinforcement is introduced in the U.S. Pat. No. 5,039,203. This does lead to an increase in the film area, but the radiation-impermeable reinforcing structure still prevents the desired radiation information from penetrating the film.

From the JP application 4-21852 it is known to use photosensitive material for balancing X-ray transmission fluctuations due to the unevenness of a beryllium membrane. In this case, however, the photosensitive material does not form a predetermined uniform structure on top of the beryllium membrane, and therefore the photosensitive material cannot serve as a reinforcing structure for the beryllium membrane.

The object of the present invention is to eliminate some of the drawbacks of the prior art and to achieve an improved and more versatile ultrathin film permeable to X-ray and ultraviolet radiation, which film is supported not only at the edges, but the film as such is provided with a reinforcement made of some photosensitive material, which reinforcment is created according to the method of the invention. The essential novel features of the invention are apparent from the appended patent claims.

According to the invention, the reinforcing structure of an ultrathin film is advantageously manufactured of a photosensitive polymer, which in the course of the manufacturing process is made chemically stable and strong, and which loses its photosensitivity. Advantageously the photosensitive polymer to be used in the production of the reinforcing structure of the invention is for instance a polyimide varnish under the commercial name PYRALIN PI 2732.

The film reinforcing structure of the invention is provided on top of a ready-made ultrathin film. This ultrathin film may be manufactured for instance of a known polyimide varnish under the commercial name PYRALIN PI 2610, which is applied as a thin layer on top of a uniform substrate and is polymerized by baking in a vacuum for between half an hour and one hour at the temperature 400° C. The employed substrate in the production of this film can be a piece formed of silicon or metal, such as copper or nickel.

According to the invention, on the surface of the ultrathin film there is applied a layer of photosensitive polyimide varnish, which is prebaked for between half an hour and one hour in air atmosphere within the temperature range of 50–100° C. On top of the prebaked reinforcing material there is then placed a negative exposure mask of the reinforcing structure to be manufactured, which is for instance lattice-like in shape. The exposure mask can, depending of the material of the reinforcing structure, also be positive. After setting the exposure mask, the photosensitive reinforcing structure material is advantageously exposed to ultraviolet radiation through the mask. After exposure and removal of the mask, the reinforcing structure material is developed, and unexposed material is removed off the surface of the ultrathin film. Thus the reinforcing structure created on the surface of the ultrathin film, which structure has a desired shape, is polymerized in an at least one-step baking treatment. The bakeing treatment is carried out at the temperature of 400° C., with a baking time of 1 hour. Now the reinforcing structure material is made chemically stable and strong and loses its photosensitivity.

In order to be able to utilize the reinforcing structure of the invention and the film connected thereto, the substrate provided on the rear side of the film must first be removed for example by wet etching, either wholly or so that the substrate forms a supporting ring at the edges of the ultrathin film. The film can also be detached from the substrate by allowing the etching solution to flow on the film and the edges thereof. Advantageously the etching solution is either a mixture of hydrofluoric acid and nitric acid for a substrate made of silicon, or for a metallic substrate only nitric acid, for example. After removing the substrate, the ultrathin film together with the reinforcing structure of the invention is washed, advantageously with a weak aqueous sodium hydroxide solution. After washing, the reinforcing structure of the invention can if necessary be subjected to another baking treatment in similar fashion as above in order to advantageously eliminate tensions and increase strength.

The ultrathin film provided with the reinforcing structure of the invention can be used, apart from windows permeable for instance to X-ray and ultraviolet radiation, in infrared filters in order to make use of the capacities of infrared radiation. Likewise the ultrathin film of the invention provided with the reinforcing structure can be used as a diffusion film in separating gases, such as hydrogen and helium, from each other.

Several advantages are achieved with the reinforcing structure of the invention as compared to the prior art: the advantageous adhesion between the ultrathin film and the reinforcing structure is created without a separate adhesion step. Likewise, the reinforcing structure is permeable to soft X-ray radiation, so that for instance soft X-ray radiation emitted from space can be received, irrespective of the reinforcing structure, along the whole surface of the film. Moreover, none of the steps in the method of the invention causes any damages to the film to be reinforced. Thus the equipment and production costs remain low. Furthermore, an increased accuracy can be observed in the production of the reinforcing structure, and because the reinforcing structure is elastic, it is not easily broken but endures well for instance possible tension changes during transportation.

Advantageously the thin film reinforcing structure of the invention is net-like or lattice-like, so that the holes in the net or lattice are essentially round or essentially polygonal in shape. The width of the strands forming the reinforcing structure is advantageously in the region of 5–50 micrometers. Depending on the size of the thin film, the open area of the film that is clear of the reinforcing structure is advantageously 50–95% of the whole radiation-permeable area of the thin film.

I claim:

1. A radiation entrance window material that is permeable to X-ray and ultraviolet radiation and comprises a film having a thickness less than about 5 μm and having first and second opposite surfaces, and an open mesh reinforcing structure adhering to the first surface of the film, the reinforcing structure being polymerized from a photosensitive material and defining a pattern of apertures, and wherein the material of the reinforcing structure comprises polyimide.

2. A window material according to claim 1, wherein the mesh defines polygonal apertures.

3. A window material according to claim 2, wherein the polygonal apertures are square.

4. A window material article according to claim 1, wherein the mesh defines circular apertures.

5. A window material according to claim 1, wherein the open mesh reinforcing structure is composed of strands that are less than 50 μm wide.

6. A window material according to claim 1, wherein the open mesh reinforcing structure is composed of strands that are from 5 μm to 50 μm wide.

7. A window material according to claim 1, wherein the apertures defined by the open mesh reinforcing structure leave clear at least 50% of the film.

8. A window material according to claim 1, wherein the apertures defined by the open mesh reinforcing structure leave clear from 50% to 90% of the film.

9. A radiation entrance window material that is permeable to X-ray and ultraviolet radiation and comprises a film having a thickness less than about 5 μm and having first and second opposite surfaces, and an open mesh reinforcing structure adhering to the first surface of the film, the reinforcing structure being polymerized from a photosensitive material and defining a pattern of apertures, and wherein the material of the film comprises polyimide.

10. A window material according to claim 9, wherein the material of the reinforcing structure comprises polyimide.

* * * * *